United States Patent [19]

Guterman

[11] Patent Number: 5,153,691
[45] Date of Patent: Oct. 6, 1992

[54] APPARATUS FOR A DUAL THICKNESS FLOATING GATE MEMORY CELL

[75] Inventor: Daniel C. Guterman, Fremont, Calif.

[73] Assignee: Xicor, Inc., Milpitas, Calif.

[21] Appl. No.: 746,170

[22] Filed: Aug. 14, 1991

Related U.S. Application Data

[63] Continuation of Ser. No. 631,208, Dec. 21, 1990, abandoned, which is a continuation of Ser. No. 369,134, Jun. 21, 1989, abandoned.

[51] Int. Cl.[5] ............................................. H01L 29/78
[52] U.S. Cl. ................................ 357/23.14; 357/23.5; 357/54; 357/59
[58] Field of Search ................... 357/23.14, 23.5, 54, 357/59

[56] References Cited

U.S. PATENT DOCUMENTS

| | | | |
|---|---|---|---|
| 4,274,012 | 6/1981 | Simko | 307/238.3 |
| 4,300,212 | 11/1981 | Simko | 365/185 |
| 4,462,090 | 7/1984 | Iizuka | 365/185 |
| 4,486,769 | 12/1984 | Simko | 357/41 |
| 4,794,433 | 12/1988 | Kamiya et al. | 357/23.5 |

OTHER PUBLICATIONS

Muller et al, *Device Electronics for IC's*, 1986, pp. 452–454.
Heimann, P. A., et al., "Electrical Conduction and Breakdown in Oxides of Poly-Crystalline Silicon and Their Correlation with Interface Texture", Journal of Applied Physics 53(9), Sep. 1982, pp. 6240–6245, American Institute of Physics.

Primary Examiner—Andrew J. James
Assistant Examiner—Stephen D. Meier
Attorney, Agent, or Firm—McCubbrey, Bartels, Meyer & Ward

[57] ABSTRACT

A semiconductor integrated circuit device is disclosed having first and second conducting layers, with the first layer having a shape which enhances field emission tunneling off of the surface thereof. A dual thickness dielectric layer separates the conducting layers. When a potential difference is applied between the conducting layers, field emission tunneling occurs primarily through the thinner portion of the dielectric layer. A method for forming a semiconductor integrated circuit device comprises the steps of (a) forming a first conducting layer, (b) forming regions of enhanced field emission on said first conducting layer, (c) forming a second insulating layer on the first conducting layer, (d) forming a masking layer (e) undercutting the second insulating layer, (f) etching the first conducting layer according to the masking pattern, (g) forming a third insulating layer on all exposed surfaces of the first conducting layer, such that a resultant insulating layer has first and second regions of different thicknesses, and (h) forming a second conducting layer over said resultant insulating layer.

13 Claims, 4 Drawing Sheets

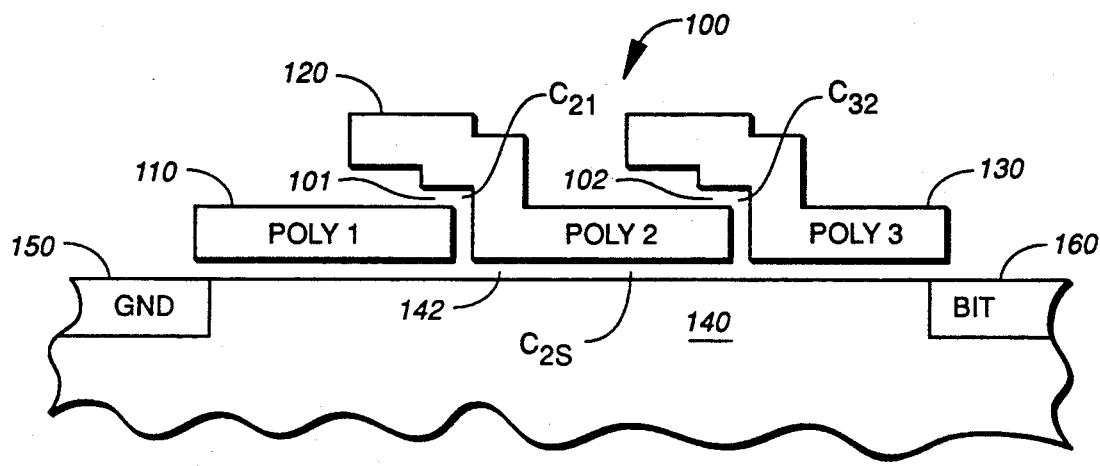
FIG._1
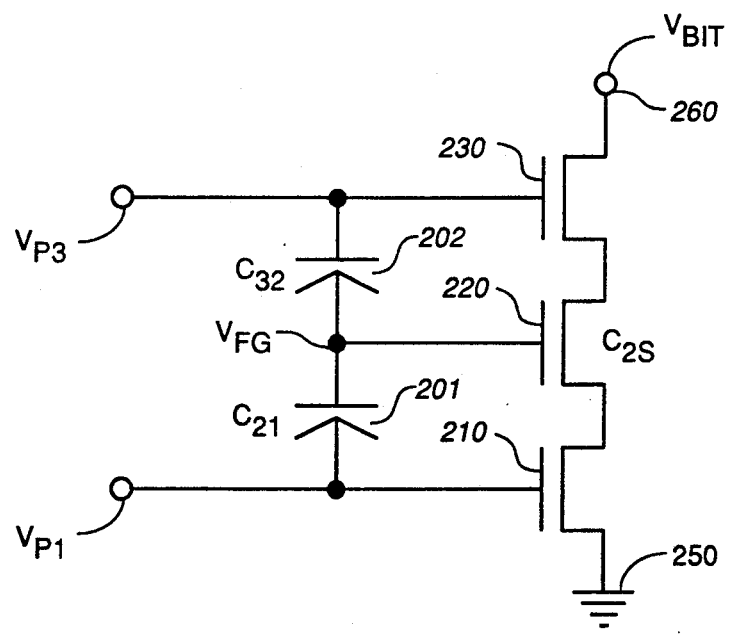
FIG._2

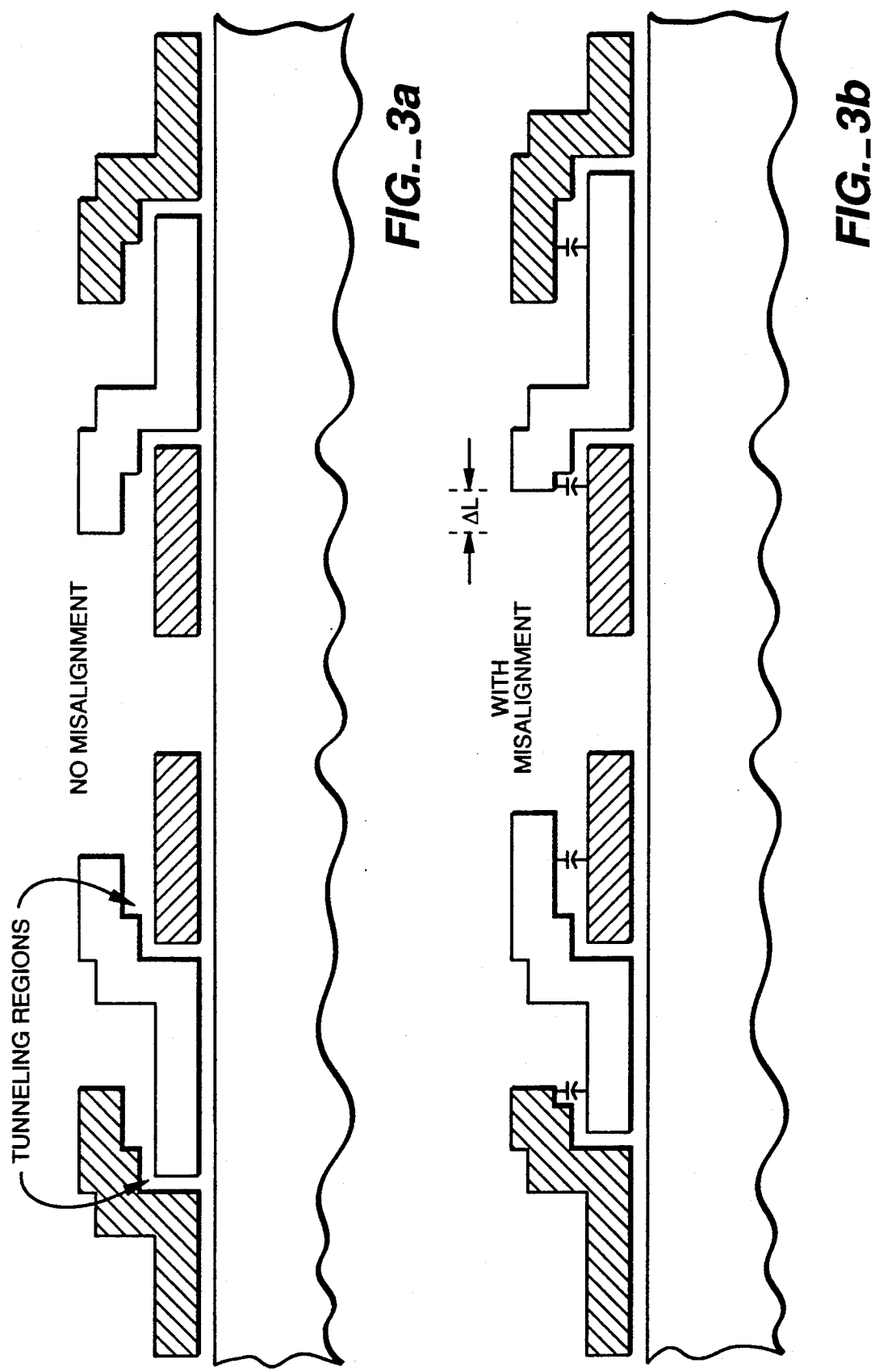

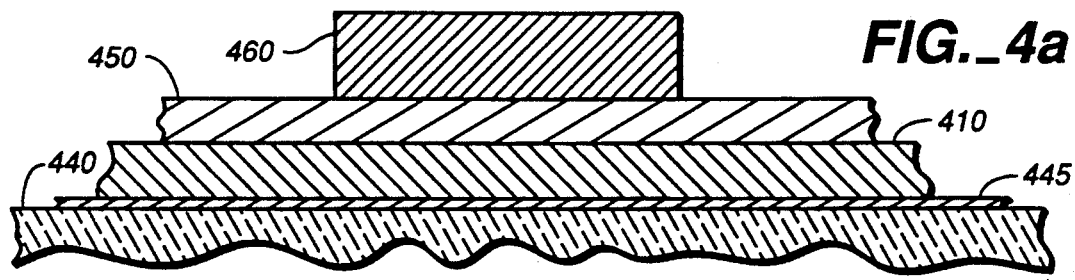
*FIG._4a*
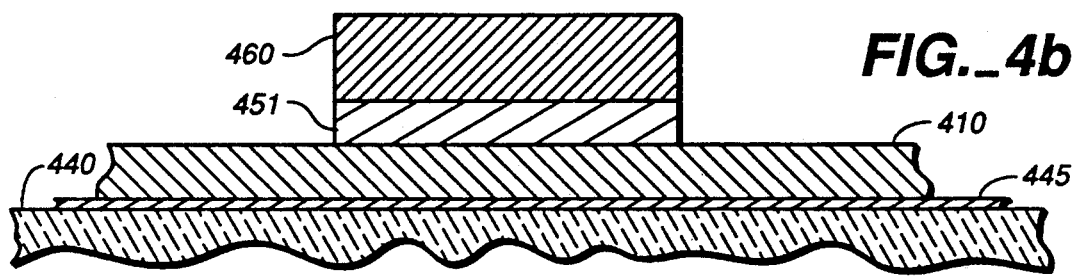
*FIG._4b*
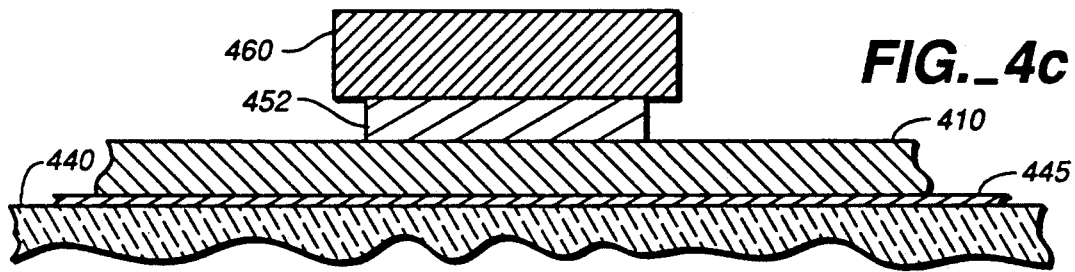
*FIG._4c*
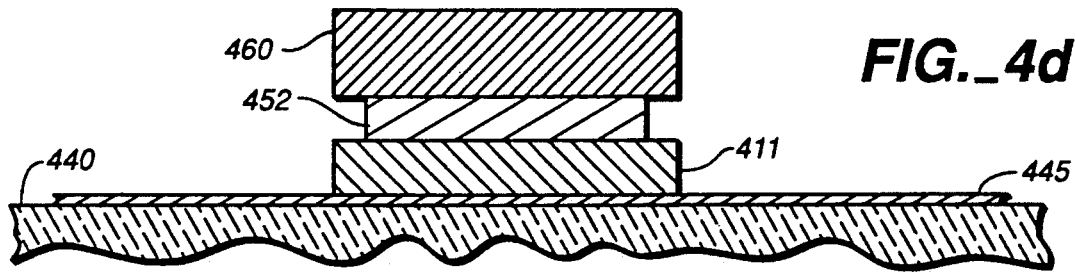
*FIG._4d*
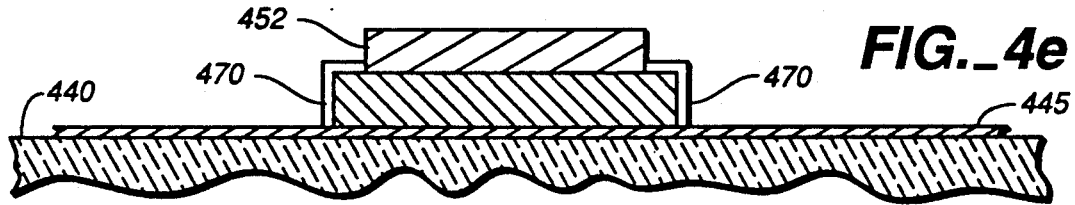
*FIG._4e*
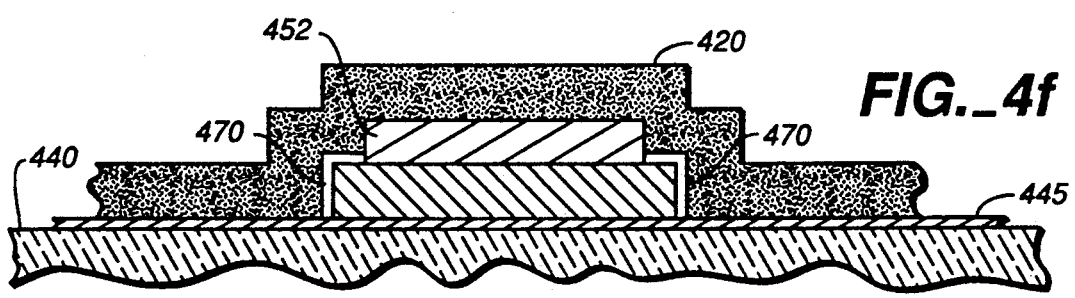
*FIG._4f*

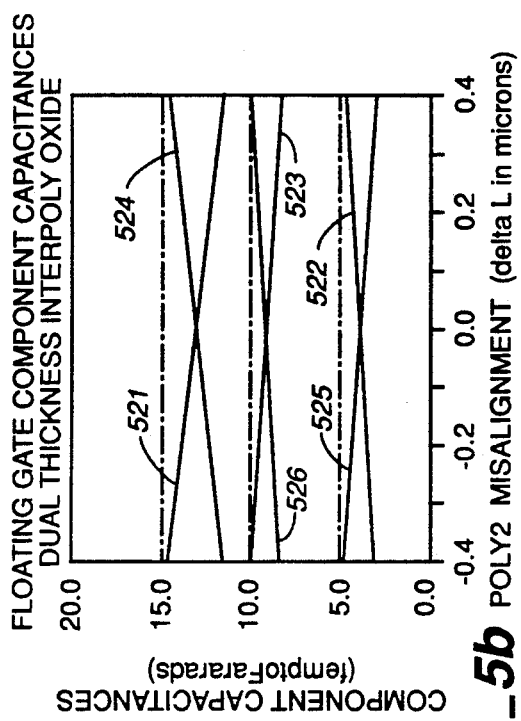
FIG._5a
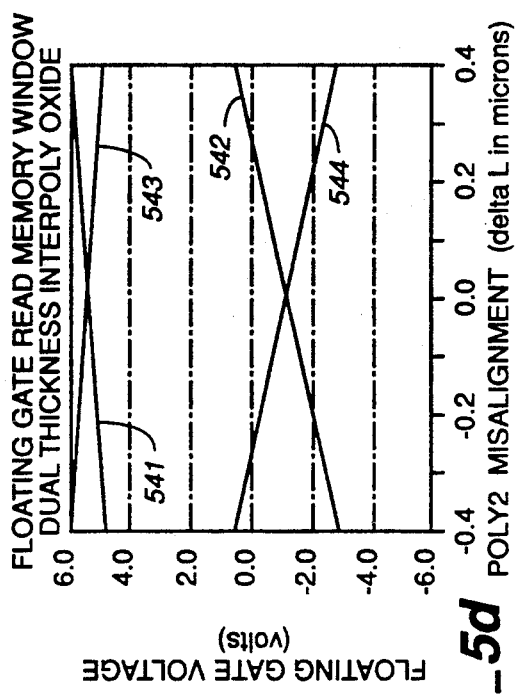
FIG._5b
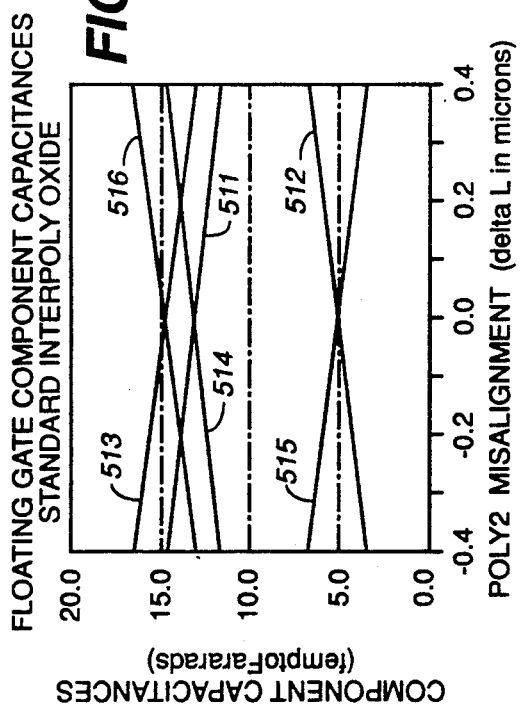
FIG._5c
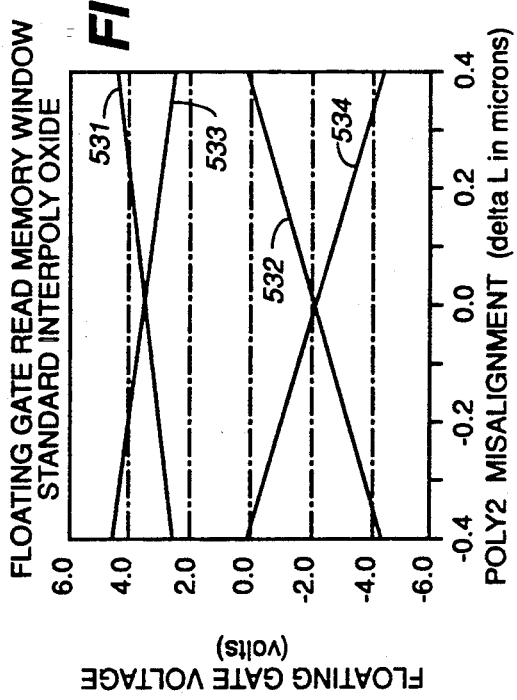
FIG._5d

APPARATUS FOR A DUAL THICKNESS FLOATING GATE MEMORY CELL

This application is a continuation of application Ser. No. 631,208, filed Dec. 21, 1990, now abandoned, which was a continuation of application Ser. No. 369,134, filed Jun. 21, 1989, now abandoned.

FIELD OF THE INVENTION

The present invention relates generally to nonvolatile memory cells and more particularly to a memory cell having a dielectric layer with two different thicknesses formed between two conducting layers and wherein field emission tunneling is caused to occur through the lesser dielectric thickness.

BACKGROUND OF THE INVENTION

Integrated circuit memory devices have been developed which store data for indefinite periods of time and which also have the capability of selectively changing the data stored. Of particular interest here is a nonvolatile memory device which utilizes a memory cell which is completely surrounded by a relatively thick insulating material or dielectric and is thus termed a "floating gate". Nonvolatile memory cells may be arranged, as is known in the art, to construct nonvolatile random access memories (NOVRAMs) and electrically erasable programmable read-only memories (EEPROMs). U.S. Pat. No 4,300,212 and U.S. Pat. No. 4,486,769, for example, disclose a NOVRAM and an EEPROM, respectively.

Some EEPROMs made with the so called "thin oxide" technology utilize relatively thin layers of insulating silicon dioxide with two different thicknesses. However, EEPROMs made with this technology have a region of ultra thin (80 to 150 Angstroms) dielectric through which bi-directional tunneling occurs between a smooth single crystal surface and a polysilicon layer.

The fabrication of a memory cell typically consists of depositing and patterning layers of polysilicon with layers of insulating oxide in between. Patterning may be done using conventional photolithographic techniques well known in the industry. More specifically, first polysilicon layer is formed and patterned on a first dielectric layer formed on silicon substrate. A second dielectric layer is then formed to completely surround the first polysilicon layer and to form a tunneling oxide on the surface of the first polysilicon layer. A second polysilicon layer is formed and patterned on top of the second dielectric layer. A third dielectric layer is formed on the second polysilicon layer such that the second polysilicon layer is completely surrounded by dielectric. A third polysilicon layer is then formed and patterned on top of the third dielectric layer. Finally, a fourth dielectric layer is deposited over the entire memory cell.

Typically, the first polysilicon layer is a programming electrode, the second polysilicon layer is the floating gate, and the third polysilicon layer is an erase electrode. The floating gate generally lies between the programming electrode and the erase electrode and partially overlies the former and is itself partially overlain by the latter. Beneath and insulated from the floating gate is the substrate. In one configuration, there is an electrically isolated bias electrode disposed in the substrate of opposite conductivity to the substrate. This bias electrode forms one plate of a coupling capacitor to the floating gate and is also referred to as a metallurgical "paddle". In another configuration there is no metallurgical paddle disposed in the substrate.

Programming, erasing, and retaining information on the floating gate is achieved by controlling the flow of electrons to and from the floating gate. Since the polysilicon layers are insulated from each other by the layers of oxide, the electrons must "tunnel" either from the programming electrode to the floating gate or from the floating gate to the erase electrode. The electron tunneling is controlled by the relative potentials between the electrodes and the floating gate.

The floating gate voltage operating window is defined to be the difference between the positive potential on the floating gate when the floating gate has been erased and the level of negative potential on the floating gate when the floating gate has been programmed. Favorable operating conditions are obtained when this operating window is large and remains large. As the device is alternately programmed and erased, the size of the operating window decreases, thereby shortening the remaining usable lifetime of the device. Thus, a continuing objective of floating gate devices is to increase the operating window size and to maintain that increased window size for a greater number of program and erase cycles, thereby increasing the useful lifetime of the device.

A generally desirable objective of most semiconductor devices is miniaturization. As devices become smaller, however, any misalignment of the polysilicon layers will produce changes in the capacitance between the layers which adversely affects the operation of the device.

Accordingly, it is an object of the present invention to provide a memory cell which reduces alignment sensitivity between polysilicon layers by forming a second thicker dielectric layer between the polysilicon layers in all areas except for those regions where tunneling is to occur.

It is a further object of the present invention to provide a memory cell having less sensitivity to variations in alignment or dimensions of various cell elements (linewidths) thereby providing an improved floating gate memory cell operating window over a wide range of processing variations.

It is yet a further object of the present invention to provide a memory cell having an improved operating window thereby lowering the operating voltage requirements and providing a tighter distribution of the voltages required to operate an array of memory cells.

SUMMARY OF THE INVENTION

The present invention comprises a semiconductor integrated circuit device having first and second conducting layers, wherein the first conducting layer includes a surface having a localized curvature which enhances the electric field locally such that enhanced field emission tunneling of electrons occurs from the first conducting layer through the dielectric layer to the second conducting layer when a potential difference is applied between said first and said second conducting layers. A dielectric layer is disposed between and separating the first and second conducting layers and includes a first portion having a first thickness and a second portion having a second greater thickness, such that when said potential difference is applied between the first conducting layer and the second conducting layer, field emission tunneling occurs primarily through the first portion of the dielectric layer from the first conducting layer to the second conducting layer.

The present invention also comprises a method for forming a semiconductor integrated circuit device comprising the steps of (a) forming a first conducting layer, (b) forming a dielectric layer on top of said first conducting layer, and (c) forming a second conducting layer on top of said dielectric layer, wherein the first conducting layer includes a surface having a localized curvature which enhances the electric field locally such that enhanced field emission tunneling of electrons occurs from the first conducting layer through the dielectric layer to the second conducting layer when a potential difference is applied between the first and second conducting layers, and wherein the dielectric layer includes a first portion having a first thickness and a second portion having a second greater thickness, such that when said potential difference is applied between said first conducting layer and said second conducting layer, field emission tunneling occurs primarily through the first portion of said dielectric layer from the first conducting layer to the second conducting layer.

The present invention also comprises a method for forming a semiconductor integrated circuit device comprising the steps of (a) forming a first conducting layer, (b) forming an insulating layer of a predetermined second thickness on a top surface of the first conducting layer, the formation of the insulating layer resulting in the top surface of the first conducting layer being microtextured, (c) forming a masking layer having a predetermined pattern on a top surface of the insulating layer thereby forming a pattern in the insulating layer so as to expose predetermined regions of the first conducting layer, (d) under-cutting the insulating layer by an etching process a predetermined amount interior to the edge boundaries of the masking layer, (e) etching the first conducting layer according to the predetermined pattern defined by the masking layer, (f) forming a second insulating layer on all exposed surfaces of the first conducting layer, the second insulating layer having first and second regions of different predetermined thicknesses, and (g) forming a second conducting layer over the third insulating layer.

BRIEF DESCRIPTION OF THE DRAWINGS

FIG. 1 is a schematic cross-sectional view of a dual thickness interpoly oxide floating gate nonvolatile memory cell according to the present invention.

FIG. 2 is a schematic of an equivalent circuit describing the operation a floating gate nonvolatile memory cell according to the present invention.

FIGS. 3(a) and 3(b) are schematic cross-sectional views of aligned mirrored memory cells according to the present invention and misaligned mirrored memory cells, respectively.

FIGS. 4(a) to 4(f) are schematic cross-sectional views of a process to form a dual thickness dielectric layer according to the present invention.

FIGS. 5(a) to 5(d) illustrate an example of the improvement to the floating gate memory window according to the present invention.

DETAILED DESCRIPTION OF THE INVENTION

A schematic cross-sectional view of a dual thickness interpoly oxide as applied to a paddleless floating gate nonvolatile memory cell according to the present invention is shown in FIG. 1 at 100. A programming electrode 110 is formed from a first polysilicon layer (poly 1), a floating gate 120 is formed from a second polysilicon layer (poly 2), and an erase electrode 130 is formed from a third polysilicon layer (poly 3). The layers are separated from each other and from substrate 140 by layers of dielectric material such as silicon dioxide. The portion of the dielectric layer between the floating gate 120 and the programming electrode 110 is a tunneling element 101 and the portion of dielectric between the erase electrode 130 and the lower portion of the floating gate 120 is a tunneling element 102. The capacitances of tunneling elements 101 and 102 are denoted by $C_{21}$ and $C_{32}$, respectively. The capacitance between floating gate 120 and substrate 140 is denoted by $C_{2S}$ (the "steering capacitance"). A ground terminal 150 is disposed in substrate 140 proximate programming electrode 110 and a bit line terminal 160 is disposed in substrate 140 proximate erase electrode 130.

By suitably treating the conducting layers, the surfaces of the floating gate and the programming electrode are microtextured to produce curved surfaces which enhance the electric field locally. This local field enhancement creates the high fields necessary to cause Fowler-Nordheim field emission tunneling with relatively low voltages applied across the tunneling dielectric. For example, a 1000 angstrom silicon dioxide layer grown on a polished single crystal substrate typically tunnels when 80-100 volts is applied across it. A similar 1000 angstrom oxide formed on textured polysilicon typically tunnels when only 10 to 20 volts is applied across the oxide. It is this field enhancement due to the localized curvature or microtexturing of the surface of the polysilicon layer that allows a relatively thick dielectric layer to be used in the present invention. These locally curved or microtextured regions may be formed on the top surface or edge surfaces of the polysilicon layers depending on the type of processes, including oxidation, following the polysilicon deposition. The amount of curvature or microtexturing is adjusted through the ensuing processes to set the desired voltage at which tunneling occurs.

An equivalent circuit describing the memory cell of FIG. 1 is shown in FIG. 2. The potentials of the polysilicon layers are given by $V_{P1}$ (for poly 1), $V_{FG}$ (for the poly 2 floating gate), and $V_{P3}$ (for poly 3). The tunneling elements are shown schematically as 201 and 202. The poly layers each form the gates of a field effect transistor with poly 3 forming the gate of a transistor 230, poly 2 forming the gate of transistor 220, and poly 1 forming the gate of transistor 210. The channel regions of these transistors 210, 220, and 230 are formed within the surface 142 of substrate 140 (as shown in FIG. 1). The bit line voltage $V_{BIT}$ 260, ground 250, and capacitances $C_{21}$, $C_{32}$, and $C_{2S}$ are also shown.

The floating gate voltage operating window (also known as the memory window) is defined to be the difference between the positive potential on the floating gate when the floating gate has been erased and the level of negative potential on the floating gate when the floating gate has been programmed. Based on FIG. 2, the floating gate voltage after writing may be approximately expressed as:

$$V_{FG} = (V_{FG})_{P.E} + \frac{\sum_j C_j V_j}{\sum_j C_j} \quad (1)$$

where

-continued $$(V_{FG})_P = \frac{C_{21} - C_{32}}{C_{21} + C_{32}} \cdot \frac{V_{P3} - V_{P1}}{2} \quad (2)$$

for the programmed state, and $$(V_{FG})_E = \frac{C_{21} - C_{32}}{C_{21} + C_{32} + C_{2S}} \cdot \frac{V_{P3} - V_{P1}}{2} + \frac{C_{2S}}{C_{21} + C_{32} + C_{2S}} \cdot \frac{V_{P3} + V_{P1}}{2} \quad (3)$$

for the erased state where $(V_{FG})_E$ is the erase state floating gate voltage and $(V_{FG})_P$ is the program state floating gate voltage and where $V_{P1}$ and $V_{P3}$ are the potentials used during the write operation. The summation over j in Equation (1) extends over the parasitic capacitances that are "seen" by the floating gate and can be cut off at any desired number depending on significance of the terms. A typical value for j is 6. Equations (2) and (3) are derived considering only the capacitance terms shown, assuming all other capacitances are sufficiently small to be ignored. The steering capacitance $C_{2S}$ for this paddleless case is assumed to have the full metallurgical capacitance value of the floating gate to the substrate for the programmed state and to approach zero for the erased state. These conditions are further assumed to hold for both write and read operations. The tunneling voltages (voltages across the tunneling elements necessary to maintain the required tunneling currents during write operations) are assumed to be equal and of a value that is half of the total voltage applied between poly 3 and poly 1 during a write operation.

A memory cell with a paddle typically has a bias electrode disposed in, and of opposite conductivity to, the substrate region beneath the floating gate and the store electrode. If the capacitance between the floating gate and the paddle is given by $C_{2M}$ and the remaining part of the steering capacitance is comprised of non-metallurgical channel capacitance, given by $C_{2C}$, the equations for the programmed and erased states floating gate voltages are given by $$(V_{FG})_P = \frac{C_{21} - C_{32}}{C_{TOT}} \cdot \frac{V_{P3} - V_{P1}}{2} + \frac{C_{2M} + C_{2C}}{C_{TOT}} \cdot \frac{V_{P3} + V_{P1}}{2} - \frac{C_{2M} + 1/C_{2C}}{C_{TOT}} V_{BIT} \quad (4)$$

and $$(V_{FG})_E = \frac{C_{21} - C_{32}}{C_{TOT}} \cdot \frac{V_{P3} - V_{P1}}{2} + \frac{C_{2M} + C_{2C}}{C_{TOT}} \cdot \frac{V_{P3} + V_{P1}}{2} \quad (5)$$

where $C_{TOT} = C_{21} + C_{32} + C_{2M} + C_{2C}$, and where $V_{BIT}$ is the bitline voltage.

Equations (4) and (5) were derived assuming that only those capacitances appearing are significant. $C_{2M}$ is also assumed to be much larger than $C_{2C}$, and that for the programmed state, $C_{2C}$ is only half of its full metallurgical capacitance value, and is its full capacitance value otherwise. This assumption has been found to reasonably describe observed behavior. The tunneling voltages across each of the tunneling elements are also assumed to be equal and of a value equal to half of the total voltage applied between poly 3 and poly 1 during write (just as in the paddleless case).

Since the size of the memory window is just the erased state potential minus the programmed state potential, subtracting Equation (4) from Equation (5) gives the size S of the memory window.

$$S = \frac{C_{2M} + (1/2)C_{2C}}{C_{TOT}} V_{BIT} \quad (6)$$

where the expression $(C_{2M} + \frac{1}{2}C_{2C})/C_{TOT}$ is known as the "Capacitance Coupling Efficiency."

Equation (6) shows that the size of the memory window is directly proportional to the capacitance coupling efficiency.

Thus, in order to maximize the size of the memory window of a memory cell, it is desirable to make the capacitance coupling efficiency as close to 100% as possible. That is, $C_{2M}$ and $C_{2C}$ should be much larger than $C_{32}$ and $C_{21}$.

Thus, one way to increase the size of the memory window is to decrease the values of capacitances $C_{32}$ and $C_{21}$. This can be achieved by increasing the thickness of the dielectric layers in all areas except in the regions of the first and second polysilicon layers where enhanced field emission electron tunneling is desired. Since the tunneling element capacitances $C_{32}$ and $C_{21}$ are sensitive to the thickness of the dielectric between the first and second polysilicon layers, the program/erase window will be increased if the thickness of the dielectric layers overlaying programming electrode 110 and floating gate 120 are increased.

A thicker dielectric layer also reduces the alignment sensitivity between the polysilicon layers. A thicker oxide layer means a reduced per unit area capacitance which results in a floating gate cell operating window which is less sensitive to misalignment.

In arrays of memory cells, the cells are typically mirrored around electrical contact lines. Misalignment of polysilicon layers may occur during fabrication of the cells. Aligned mirrored memory cells according to the present invention and misaligned mirrored memory cells are shown in FIGS. 3(a) and 3(b), respectively.

As shown in FIG. 3(b), the second polysilicon layer is misaligned by an amount given by ΔL. This change of relative dimension results in an increase or decrease of the corresponding interpoly capacitance. There are various components of interpoly capacitance in semiconductor devices. Of interest here is the so-called variable capacitance arising from the planar interpoly region. This capacitance is strongly dependent on misalignment. The capacitance of the planar region (flat plate capacitance) is given by:

$$C = \frac{e_{ox}WL}{t_{ox}} \quad (7)$$

where
W = the width of the polysilicon overlap region
L = the length of the overlap region
$t_{ox}$ = the thickness of the interpoly oxide
$e_{ox}$ = the dielectric constant of the oxide Utilization of a thicker dielectric oxide for a significant portion of the planar region between the polysilicon layers thus decreases the total interpoly capacitance by reducing the flat plate capacitance. It likewise reduces the sensitivity of the capacitance to misalignment (dC/dL).

Under one case of misalignment conditions of the second polysilicon layer to the first and the third layer to the second, the capacitance of one tunneling element will grow while the other shrinks. This results in a shift of the center of the operating window which is given approximately by:

$$\Delta V_{WC} \cong \frac{\Delta C_{21} - \Delta C_{32}}{C_{TOT}} V_{TUN} \qquad (8)$$

$$\text{where } \Delta C_{21} = \frac{e_{ox} W \Delta L}{t_{ox}}$$

$$\text{and } \Delta C_{32} = \frac{-e_{ox} W \Delta L}{t_{ox}}$$

and where $V_{TUN}$ is the tunneling voltage across the tunnel elements and $\Delta C_{21}$ and $\Delta C_{32}$ are the change in respective capacitances due to misalignment.

The shift in the operating window center occurs for the following reason. During a write operation the first polysilicon layer and the third polysilicon layer capacitively pull in opposite directions (e.g., −3 volts and +25 volts) while during read, they capacitively pull in the same direction (e.g., both go to +5 volts). Consequently, any capacitance imbalance due to misalignment will result in a floating gate memory window shift and this shift does not get compensated by the read operation bias conditions. Since in an array of memory cells the cells are mirrored around the electrical contact lines, this means that every other row of cells will have window shifts in one direction, while the other rows of cells will window shift in the opposite direction. Reference cells which track misalignment may ameliorate the situation, but there is a limit to the reference cell approach which occurs when the window is shifted so far negatively that an erased state floating gate voltage is too low to provide the necessary sensing current, or when the window shift is so positive that program cell conduction is excessive.

The dual thickness thick insulating layer of the present invention thus achieves distinct advantages over the prior art. For satisfactory levels of electron transmission to occur, some means must exist for enhancing the Fowler-Nordheim emission from the pertinent surface of the emitting conducting layer. The present invention preferably utilizes such a means comprising the formation of a microtextured surface on the emitting conducting layer. Other means for enhancing field emission by the pertinent conducting layer will be clear to those skilled in the semiconductor arts and thus are within the scope of the present invention. An example of such a means is enhanced emission from regions of the conducting layer with localized curvature, such as at corners or indentations on the surface thereof.

A process to form a dual thickness dielectric layer according to the present invention is illustrated using cross-sectional views in FIGS. 4(a) to 4(f). FIG. 4(a) shows a substrate 440 which has already undergone various conventional processing steps. Grown on top of substrate 440 is a gate oxide layer 445 of a predetermined thickness to provide the appropriate capacitance between substrate 440 and a first polysilicon layer 410 which is deposited on top of gate oxide layer 445. A thick interpoly oxide layer 450 is formed on first polysilicon layer 410. Conventional oxide layers are approximately 550 Angstroms thick. In the preferred embodiment of the present invention, thick oxide layer 450 is at least double the thickness of a conventional oxide layer. For example, the thickness of thick oxide layer 450 can be greater than or equal to 1400 Angstroms. Thick oxide layer 450 may be formed, for example by low-pressure chemical vapor deposition or thermal oxidation. In forming thick oxide layer 450 on first polysilicon layer 410, the surface of the latter becomes microtextured, producing locally curved surfaces which enhance the electric field locally such that enhanced field emission tunneling is enabled to occur from the surface of the polysilicon layer 410. A photoresist layer 460 is applied to thick oxide layer 450 in a conventional manner. FIG. 4(b) shows a conventional anisotropic oxide etch step wherein thick oxide layer 450 (of FIG. 4(a)) is etched according to a pattern established by photoresist layer 460 to form thick oxide layer 451.

FIG. 4(c) shows the step of under-cutting thick oxide layer 451 (of FIG. 4(b)) with respect to the overlying photoresist layer 460. This under-cutting is performed using conventional wet or plasma oxide etch techniques to form an under-cut thick oxide layer 452. The under-cut can be uniformly done and is easily reproducible. The amount of under-cut is several times the thickness of the thick oxide layer according to the present invention. For example, the under-cut can be 0.2 to 0.3 microns. FIG. 4(d) shows the next step of the anisotropic etch of first polysilicon layer 410 (of FIGS. 4(a) to 4(c)) to form first polysilicon layer 411 which is sized to conform to the desired specifications of the memory cell being fabricated. Note that the boundaries of the photoresist layer 460 define the boundaries of etched polysilicon layer 411. Photoresist 460 (of FIGS. 4(a) to 4(d)) is then removed. FIG. 4(e) shows the process for forming tunneling oxide layers 470 by forming an insulating oxide layer over the exposed regions of first polysilicon layer 411 and first gate oxide layer 445. This results particularly in an insulating oxide layer on the shoulders of first polysilicon layer 411 contiguous with under-cut thick oxide layer 452. Note that thick oxide portion 452 can be masked during formation of oxide layer 470 or its thickness increased when layer 470 is formed, in a manner conventional in the art. Oxide layers 470 are formed so as to have a predetermined thickness that is much less than the thickness of oxide layer 450 (e.g., approximately 450 Angstroms versus 1400 Angstroms). This approach allows the precise control of the critical dimensions of the tunneling regions according to the present invention. A second polysilicon layer 420 is deposited over under-cut thick oxide layer 452, tunneling regions 470, and gate oxide layer 445 in a conventional manner as shown in FIG. 4(f).

Experimentation has shown that the increased thickness of thick oxide layer 452 reduces nominal interpoly capacitance $C_{32}$ by approximately 40% and nominal interpoly capacitance $C_{21}$ by approximately 25%. This results in two significant improvements.

First, the nominal floating gate memory window margin (erased state voltage minus program state voltage) is improved by approximately 1 volt, which is approximately an 18% improvement in memory window size. Second, memory cells fabricated according to the present invention have reduced sensitivity to misalignment by approximately a factor of 2. For example, if the interpoly oxide is four times thicker, the window center shift is only one-fourth that produced by a thinner oxide for the same misalignment. This is a result of the reduced per unit area capacitance which produces a memory window center which is less sensitive to misalignment.

An example of the improvement on the floating gate memory window is illustrated in FIGS. 5(a) to 5(d). The + and − signs denote the cell and its mirror image. FIG. 5(a) shows the values of the various capacitances as a function of poly 2 misalignment (L) for the case of a single thickness oxide layer. Capacitor C2S− is shown at 511, capacitor C21− is shown at 512, capacitor C32− is shown at 513, capacitor C2S+ is shown at 514, capacitor C21+ is shown at 515 and capacitor C332+ is shown at 516 in FIG. 5(a). FIG. 5(b) shows the capacitances according to the present invention. In FIG. 5(b), capacitor C2S− is shown at 521, capacitor C21− is shown at 522, capacitor C32− is shown at 523, capacitor C2S+ is shown at 524, capacitor C21+ is shown at 525 and capacitor C32+ is shown at 526. As can be seen, the capacitances C21, C32 according to the present invention are almost all smaller for the entire range of misalignment shown. These decreased capacitances produce a larger floating gate memory window as a function of misalignment as shown in FIGS. 5(c) and 5(d). FIGS. 5(c) and 5(d) show the floating gate voltages for the erased and programmed states of the mirrored cells for the single thickness oxide case and the dual thickness oxide of the present invention. In FIG. 5(c) ERASE− is shown at 531, PROGRAM− is shown at 532, ERASE+ is shown at 533 and PROGRAM+ is shown at 534. In FIG. 5(d), ERASE− is shown at 541, PROGRAM− is shown at 542, ERASE+ is shown at 543 and PROGRAM+ is shown at 544. Recall that the memory window is just the erased state voltage minus the programmed state voltage. It can be seen that the present invention increases the memory window size for all values of misalignment.

By reducing the interpoly capacitances with respect to the steering capacitance, the alignment sensitivity of the memory window is reduced. This allows for the use of lower write voltages to achieve comparable memory window size for a given range of misalignment or to allow more relaxed alignment tolerances for a given write voltage.

An improved nonvolatile memory cell and a process for manufacturing same has been described. It will be appreciated by those skilled in the art that the present invention is applicable to similar devices based upon electron tunneling and controlled capacitances, and that the present invention is to be limited solely by the scope of the following claims.

What is claimed is:

1. A semiconductor integrated circuit device comprising:
    first and second conducting layers separated by a dielectric layer;
    said first conducting layer having a surface including at least one region of localized curvature which enhances the electric field locally such that enhanced field emission tunneling of electrons occurs from said first conducting layer through said dielectric layer to said second conducting layer when a sufficiently large potential difference is applied between said first and said second conducting layers; said dielectric layer including a first portion adjacent said region of localized curvature and having a first thickness and a second portion having a second substantially greater thickness, such that when said sufficiently large potential difference is applied between said first conducting layer and said second conducting layer, field emission tunneling occurs primarily through said first portion of said dielectric layer from said first conducting layer to said second conducting layer.

2. The device of claim 1 wherein said localized curvature comprises a microtextured surface formed on or adjacent to the top surface of said first conducting layer.

3. The device of claim 1 wherein said first and said second conducting layers are formed from polysilicon.

4. The device of claim 1 wherein said semiconductor integrated circuit device is a floating gate nonvolatile memory cell.

5. The device of claim 1 wherein said second thickness is at least 1,000 angstroms and said first thickness is less than 600 angstroms.

6. A floating gate non-volatile memory cell comprising:
    a first insulating layer;
    a first polysilicon layer formed on a top surface of said first insulating layer, said first polysilicon layer having a region of localized curvature comprising a microtextured surface which enhances field emission tunneling off the surface thereof;
    a second insulating layer formed on a top surface of said first polysilicon layer; a second polysilicon layer at least a portion of which is formed on a top surface of said second insulating layer, said second polysilicon layer having a region of localized curvature comprising a microtextured surface which enhances field emission tunneling off the top surface thereof; a third insulating layer at least a portion of which is formed on a top surface of said second polysilicon layer; a third polysilicon layer at least a portion of which is formed on a top surface of said third insulating layer;
    said second insulating layer including a first portion having a first thickness and a second portion having a second substantially greater thickness such that when a sufficiently large potential difference is applied between said first polysilicon layer and said second polysilicon layer, field emission tunneling occurs from said first polysilicon layer to said second polysilicon layer primarily through said first portion of said second insulating layer;
    said third insulating layer including a first portion having a first thickness and a second portion having a second substantially greater thickness such that when a sufficiently large potential difference is applied between said second polysilicon layer and said third polysilicon layer, field emission tunneling occurs primarily from said second polysilicon layer to said third polysilicon layer primarily through said first portion of said third insulating layer.

7. A floating gate non-volatile memory cell comprising:
    a first insulating layer;
    a first polysilicon layer formed on a top surface of said first insulating layer;
    a second insulating layer formed on a top surface of said first polysilicon layer such that localized curvatures in the top surface of said first polysilicon layer are enhanced such that tunneling of electrons from said top surface is promoted;
    a second polysilicon layer formed on a top surface of said second insulating layer;

said second insulating layer including a first portion having a first thickness and a second portion having a second greater thickness such that when a sufficiently large negative voltage potential is applied to said first polysilicon layer relative to said second polysilicon layer, field emission tunneling occurs primarily from said top surface of said first polysilicon layer to said second polysilicon layer primarily through said first portion of said second insulating layer.

8. The device of claim 7 wherein said first thickness is substantially less than said second thickness.

9. A floating gate non-volatile memory cell comprising:
- a first insulating layer;
- a first polysilicon layer formed on a top surface of said first insulating layer, said first polysilicon layer having a shape which enhances field emission tunneling off of the top surface thereof;
- a second insulating layer formed on a top surface of said first polysilicon layer; a second polysilicon layer formed on a top surface of said second insulating layer;
- said second insulating layer including a first portion having a first thickness and a second portion having a second greater thickness such that when a sufficiently large potential difference is applied between said first polysilicon layer and said second polysilicon layer, said potential difference being such that said second polysilicon layer is positive relative to said first polysilicon layer, field emission tunneling occurs primarily from said top surface of said first polysilicon layer to said second polysilicon layer primarily through said first portion of said second insulating layer.

10. A semiconductor integrated circuit device comprising: first and second conducting layers separated by a dielectric layer;
- said first conducting layer having a corner portion surrounded by said dielectric layer and said second conducting layer;
- said first conducting layer having a surface including at least one region of localized curvature in the vicinity of said corner which enhances the electric field locally such that enhanced field emission tunneling of electrons occurs from said first conducting layer through said dielectric layer to said second conducting layer when a sufficiently large potential difference is applied between said first and second conducting layers; said dielectric layer including a first portion adjacent said region of localized curvature and having a first thickness and a second portion having a substantially greater thickness, such that when said sufficiently large potential difference is applied between said first conducting layer and said second conducting layer, field emission tunneling occurs primarily through said first portion of said dielectric layer from said first conducting layer to said second conducting layer.

11. A floating gate non-volatile memory cell comprising:
- a substrate having a top surface;
- a first dielectric layer formed on said top surface of said substrate;
- a first polysilicon layer forming a programming electrode and disposed on a top surface of said first dielectric layer;
- a second dielectric layer disposed on a top surface of said first polysilicon layer;
- a second polysilicon layer forming a floating gate disposed partially on the upper surface of said first dielectric layer and partially overlying said second dielectric layer so as to overlie a portion of said first polysilicon layer;
- a third dielectric layer disposed on a top surface of said second polysilicon layer;
- a third polysilicon layer forming an erase electrode disposed partially on the top surface of said first dielectric layer and partially overlying said third dielectric layer so as to overlie a portion of said second polysilicon layer;
- said second dielectric layer including a first portion having a first thickness and a second portion having a second greater thickness, such that when a sufficiently large potential difference is applied between said first polysilicon layer and said second polysilicon layer, field emission tunneling occurs from said first polysilicon layer to said second polysilicon layer primarily through said first portion of said second dielectric layer; and
- said third dielectric layer including a first portion having a first thickness and a second portion having a second substantially greater thickness, such that when a sufficiently large potential difference is applied between said second polysilicon layer and said third polysilicon layer, field emission tunneling occurs from said second polysilicon layer to said third polysilicon layer primarily through said first portion of said third dielectric layer.

12. A thick dielectric floating gate memory cell, comprising:
- a program electrode having a textured upper surface for enhancing the emission of tunneling electrons, said program electrode being surrounded by a dielectric material,
- a floating gate electrode at least a portion of which overlies the textured surface of said program electrode, and at least a portion of which has a textured upper surface for enhancing the emission of tunneling electrons, said floating gate being surrounded by a dielectric material,
- means for applying a potential difference between said program electrode and said floating gate electrode so that tunneling of electrons occurs from the textured surface of said program electrode and to overlying portion of said floating gate,
- an erase electrode at least a portion of which overlies the textured surface of said floating gate, said erase electrode being surrounded by a dielectric material,
- means for applying a potential difference between said erase electrode and said floating gate so that tunneling of electrons occurs primarily from the textured surface of said floating gate electrode to the overlying portion of said erase electrode,
- wherein the thickness of said dielectric material surrounding said electrodes exceeds 400Å in those areas where tunneling occurs and wherein said dielectric material is at least 1000Å thick in at least a portion of the remaining areas.

13. The thick dielectric floating gate memory cell of claim 12 wherein said program electrode has a corner generally surrounded by said floating gate electrode, and wherein said tunneling occurs primarily in the region of said corner.

* * * * *